(12) United States Patent
Barton et al.

(10) Patent No.: US 8,044,741 B2
(45) Date of Patent: Oct. 25, 2011

(54) SYSTEMS AND METHODS FOR REDUCING FLICKER NOISE IN AN OSCILLATOR

(75) Inventors: Nathen Barton, Richardson, TX (US); Chih-Ming Hung, McKinney, TX (US)

(73) Assignee: Texas Instruments Incorporated, Dallas, TX (US)

( * ) Notice: Subject to any disclaimer, the term of this patent is extended or adjusted under 35 U.S.C. 154(b) by 109 days.

(21) Appl. No.: 12/015,940

(22) Filed: Jan. 17, 2008

(65) Prior Publication Data
US 2009/0184771 A1 Jul. 23, 2009

(51) Int. Cl.
*H03B 5/12* (2006.01)
(52) U.S. Cl. ............. 331/177 V; 331/179; 331/117 FE; 331/36 C
(58) Field of Classification Search .............. 331/34, 331/36 C, 117 R, 117 FE, 167, 177 V, 179
See application file for complete search history.

(56) References Cited

U.S. PATENT DOCUMENTS

| 6,147,567 | A   | * | 11/2000 | Welland et al. | 331/179 |
| 6,791,422 | B2  |   | 9/2004  | Staszewski et al. | |
| 7,230,504 | B1  | * | 6/2007  | Marques et al. | 331/117 FE |
| 7,253,693 | B2  | * | 8/2007  | Zhang et al. | 331/105 |
| 7,486,154 | B1  | * | 2/2009  | Tan et al. | 331/186 |
| 2005/0285687 | A1 | * | 12/2005 | Zhang et al. | 331/16 |
| 2007/0247237 | A1 | * | 10/2007 | Mohammadi | 331/36 C |

* cited by examiner

*Primary Examiner* — Ryan Johnson
(74) *Attorney, Agent, or Firm* — Wade J. Brady, III; Frederick J. Telecky, Jr.

(57) ABSTRACT

Various systems and methods for implementing dynamic logic are disclosed herein. For example, some embodiments of the present invention provide LC tank circuits having an inductance and a capacitance. In addition, the circuits include a flicker noise reducing switch that is operable to selectively incorporate the capacitance such that an output of the circuit operates at a frequency based on a combination of the inductance and the capacitance.

1 Claim, 6 Drawing Sheets

SYSTEMS AND METHODS FOR REDUCING FLICKER NOISE IN AN OSCILLATOR

BACKGROUND OF THE INVENTION

The present invention is related to oscillators, and more particularly to digitally controlled oscillators.

Figure 1:
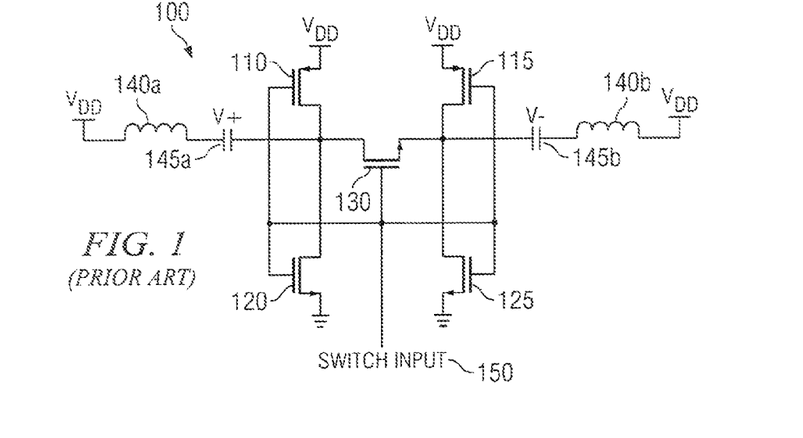
FIG. 1 depicts a prior art LC tank circuit.

Oscillators are incorporated into a number of different products and can be used, for example, to generate clocks that synchronize various circuit operations. Due to stringent phase noise requirements, most Radio Frequency (RF) oscillators for wireless communication are implemented using an LC resonator. An exemplary prior art LC tank circuit 100 (i.e., a varactor circuit with inductors) is shown in FIG. 1. LC tank circuit 100 includes two P-type transistors 110, 115, and three N-type transistors 120, 125, 130. In addition, tank circuit 100 includes an inductance 140 and a capacitance 145. The gates of N-type transistor 120, N-type transistor 125, N-type transistor 130, P-type transistor 110 and P-type transistor 115 are all electrically coupled to a switch input 150. The drain of P-type transistor 110 is electrically coupled to the drain of N-type transistor 120 and the drain of N-type transistor 130. The drain of P-type transistor 115 is electrically coupled to the drain of N-type transistor 125 and the source of N-type transistor 130.

In operation, capacitance 145 may be switched in and out of tank circuit 100 through assertion/de-assertion of switch input 150. In a typical implementation of LC tank circuit 100, N-type transistors 120, 125 and P-type transistors are chosen to be relatively small to control voltages applied to the source and drain of N-type transistor 130. Such circuits typically suffer from substantial flicker noise, and parasitic capacitances that effectively reduce the offered tuning range of an oscillator switching capacitance in and out to control a frequency output.

Thus, for at least the aforementioned reason, there exists a need in the art for advanced systems and methods for improving performance of an oscillator.

BRIEF SUMMARY OF THE INVENTION

The present invention is related to oscillators, and more particularly to digitally controlled oscillators.

Various embodiments of the present invention provide LC tank circuits. Such circuits include an inductance and a capacitance. In addition, the circuits include a switch that has reduced flicker noise and is operable to selectively incorporate the capacitance such that an output of the circuit operates at a frequency based on a combination of the inductance and the selected capacitance.

In some instances of the aforementioned embodiments, the flicker noise reducing switch includes: a first transistor, a second transistor, a third transistor, a first resistor, a second resistor. The first transistor and the first resistor are connected in series to a voltage potential, and the second transistor and the second resistor are connected in series to the voltage potential. The gate of all of the first transistor, the second transistor and the third transistor are electrically coupled to a control input. A terminal of at least one of the first transistor, the second transistor and the third transistor is/are electrically connected to the capacitance. One terminal of the third transistor is electrically coupled to the series combination of the first transistor and the first resistor, and another terminal of the third transistor is electrically coupled to the series combination of the second transistor and the second resistor. As used herein, the term "terminal" is used to mean one of a transistor input/output. Thus, for example, a terminal may be, but is not limited to, a gate, a drain or a source of a transistor. In one particular case, the combination of the first transistor, the second transistor, the third transistor and the voltage potential is a first P-type transistor, a second P-type transistor, an N-type transistor and an upper voltage potential, respectively. In another particular case, the combination of the first transistor, the second transistor, the third transistor and the voltage potential is a first N-type transistor, a second N-type transistor, a P-type transistor and a lower voltage potential, respectively. In some cases, the first and second resistors may be combined as a single resistor, while in other cases they are distinct from each other. In one particular instance of the aforementioned embodiments, the third transistor is a series combination of two or more transistors.

In other instances of the aforementioned embodiments of the present invention, the flicker noise reducing switch includes: a first transistor, a second transistor, and a resistor. In such instances, the first transistor and the resistor are connected in a series combination to a voltage potential, and the gate of both the first transistor and the second transistor are electrically coupled to a control input. A terminal of at least one of the first transistor and the second transistor is electrically connected to the capacitance, and a terminal of the second transistor is electrically coupled to the series combination of the first transistor and the resistor. In some cases, the combination of the first transistor, the second transistor and the voltage potential is a P-type transistor, an N-type transistor and an upper voltage potential, respectively. In other cases, the combination of the first transistor, the second transistor and the voltage potential is a lower voltage potential, respectively.

In some instances of the aforementioned embodiments, the flicker noise reducing switch includes a first P-type transistor, a second P-type transistor, a first N-type transistor, a second N-type transistor, a third N-type transistor, a first resistor and a second resistor. The source of the first P-type transistor and a source of the second P-type transistor are electrically coupled to an upper voltage threshold, and a source of the first N-type transistor and a source of the second N-type transistor are electrically coupled to a lower voltage threshold. The first resistor is electrically coupled between a drain of the first P-type transistor and a drain of the first N-type transistor, and the second resistor is electrically coupled between a drain of the second P-type transistor and a drain of the second N-type transistor. One leg of the third N-type transistor is electrically coupled to a first portion of the first capacitance and to the drain of the first N-type transistor, and another leg of the third N-type transistor is electrically coupled to a second portion of the first capacitance and to the drain of the second N-type transistor. A switch control is electrically coupled to gates of the first N-type transistor, the second N-type transistor, the third N-type transistor, the first P-type transistor and the second P-type transistor.

In other instances of the aforementioned embodiments, the flicker noise reducing switch includes a first N-type transistor, a second N-type transistor, a third N-type transistor, a first P-type transistor, a second P-type transistor, and a resistor. A source of the first P-type transistor and a source of the second P-type transistor are electrically coupled to an upper voltage threshold via the resistor, and a source of the first N-type transistor and a source of the second N-type transistor are electrically coupled to a lower voltage threshold. A drain of the first P-type transistor is electrically coupled to a drain of the first N-type transistor, and a drain of the second P-type transistor is electrically coupled to a drain of the second N-type transistor. One leg of the third N-type transistor is electrically coupled to a first portion of the first capacitance and to the drain of the first N-type transistor, and another leg of the third N-type transistor is electrically coupled to a second portion of the first capacitance and to the drain of the second N-type transistor. A switch control is electrically coupled to gates of the first N-type transistor, the second N-type transistor, the third N-type transistor, the first P-type transistor and the second P-type transistor.

Other embodiments of the present invention provide digitally controlled oscillator circuits. Such circuits include an oscillator circuit and a phase detector circuit. The oscillator circuit provides a frequency programmable output, and includes a bank of flicker noise reducing switches. Each flicker noise reducing switch selectively switches a capacitance in and out of the oscillator circuit. The phase detector circuit receives a frequency reference and a derivative of the output, and is operable to compare the frequency reference with a derivative of the output and to provide a control word based at least in part on the comparison of the frequency reference and the derivative of the output. The control word governs switching of the bank of flicker noise reducing switches In some instances of the aforementioned embodiments, each of the first and second flicker noise reducing switches includes a first P-type transistor, a second P-type transistor, a first N-type transistor, a second N-type transistor, a third N-type transistor, a first resistor and a second resistor. The source of the first P-type transistor and a source of the second P-type transistor are electrically coupled to an upper voltage threshold, and a source of the first N-type transistor and a source of the second N-type transistor are electrically coupled to a lower voltage threshold. The first resistor is electrically coupled between a drain of the first P-type transistor and a drain of the first N-type transistor, and the second resistor is electrically coupled between a drain of the second P-type transistor and a drain of the second N-type transistor. One leg of the third N-type transistor is electrically coupled to a first portion of the first capacitance and to the drain of the first N-type transistor, and another leg of the third N-type transistor is electrically coupled to a second portion of the first capacitance and to the drain of the second N-type transistor. A switch control is electrically coupled to gates of the first N-type transistor, the second N-type transistor, the third N-type transistor, the first P-type transistor and the second P-type transistor.

In other instances of the aforementioned embodiments, each of the flicker noise reducing switches includes a first N-type transistor, a second N-type transistor, a third N-type transistor, a first P-type transistor, a second P-type transistor, and a resistor. A source of the first P-type transistor and a source of the second P-type transistor are electrically coupled to an upper voltage threshold via the resistor, and a source of the first N-type transistor and a source of the second N-type transistor are electrically coupled to a lower voltage threshold. A drain of the first P-type transistor is electrically coupled to a drain of the first N-type transistor, and a drain of the second P-type transistor is electrically coupled to a drain of the second N-type transistor. One leg of the third N-type transistor is electrically coupled to a first portion of the first capacitance and to the drain of the first N-type transistor, and another leg of the third N-type transistor is electrically coupled to a second portion of the first capacitance and to the drain of the second N-type transistor. A switch control is electrically coupled to gates of the first N-type transistor, the second N-type transistor, the third N-type transistor, the first P-type transistor and the second P-type transistor.

Yet other embodiments of the present invention provide methods for generating a frequency output. Such methods include providing an oscillator circuit having a frequency programmable output. The oscillator includes an inductance, a first flicker noise reducing switch electrically coupled to a first capacitance, and a second flicker noise reducing switch electrically coupled to a second capacitance. The first flicker noise reducing switch is controlled by a first bit of a generated control word, and the second flicker noise reducing switch is electrically coupled to a second bit of the generated control word. The methods further include generating control words that cause the first flicker noise reducing switch to open or close resulting in a combination of the first capacitance with at least the inductance to cause the frequency programmable output to operate at a first frequency; and that cause the second flicker noise reducing switch to open or close resulting in a combination of the second capacitance with at least the inductance to cause the frequency programmable output to operate at a second frequency.

In particular instances of the aforementioned embodiments, the methods further include providing a frequency reference, and comparing the frequency reference with a derivative of the frequency programmable output. In such instances, the first codeword and the second codeword are generated based at least in part on the comparison of the frequency reference with the derivative of the frequency programmable output. As an example, in one particular case where the comparison of the frequency reference with the derivative of the frequency programmable output indicates that the frequency programmable output leads the frequency reference, the codeword causes a decrease in the frequency of the frequency programmable output. As another example, in a case where the comparison of the frequency reference with the derivative of the frequency programmable output indicates that the frequency programmable output lags the frequency reference, the codeword causes an increase in the frequency of the frequency programmable output.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to oscillators, and more particularly to digitally controlled oscillators.

Referring to the circuit of FIG. 1, in the on-state (i.e., where a high voltage is applied to the gate of N-type transistor 130), the DC bias voltages on the source and drain of N-type transistor 130 are not well defined if the N-type transistors 120 and 125 are not present. In some cases, such ill-defined bias voltages may prevent a proper impedance change on N-type transistor 130, or may cause the effective capacitance of the LC oscillator to slowly vary with time impacting stability of the oscillator and effective frequency tuning range of the oscillator. To avoid this, the source and drain of N-type transistor 130 may be anchored at zero volts during the on-state. This may be accomplished by using N-type transistors 120 and 125 with a low on-state resistance. In the off-state, N-type transistor 130 is effectively removed from the circuit. Thus, the voltage swing on the source and drain of N-type transistor 130 is nearly as large as in the oscillator. To ensure the N-type transistors 130, 120 and 125 are completely turned off and to minimize the parasitic capacitances at source and drain nodes of N-type transistor 130, source and drain DC bias voltage on N-type transistor 130 may be raised to a relatively high voltage potential during the off-state. This may be accomplished by using two P-type transistors, 110 and 115, with a relatively high on-state resistance. However, all four transistors, 110, 115, 120 and 125 introduce substantial parasitic capacitance which degrades the maximum achievable tuning range of the oscillator. In addition, small P-type transistors used for creating high resistance tend to introduce significant flicker noise into the oscillator, to the extent that this type of noise typically dominates the close-in oscillator spectrum. In contrast, flicker noise in the small N-type transistors used for creating low resistance is generally not an issue. Flicker noise is proportional to the transistor drain current, carrier mobility and the transistor output resistance, thus, a low on-state resistance across the small N-type transistors in combination with the biasing thereof assures that these transistors do not contribute problematic levels of flicker noise.

In the off-state when the P-type transistors are active, the signal swing across P-type device 110 and P-type device 115 causes relatively large voltages to develop, inducing significant drain currents, mobility fluctuation, and higher output resistance in these resulting in considerable flicker noise. The flicker noise is made worse in these P-type devices because these transistors cycle in and out of the saturation region. In saturation, the drain currents flow close to the gate oxide where surface traps cause relatively large amounts of flicker noise compared to the same drain current in the same linear-biased device.

It has been discovered that generally accepted techniques for reducing flicker noise cannot be effectively applied to resolve the problems with the circuit of FIG. 1. In particular, such techniques for reducing flicker noise in a transistor involve increasing the length of the P-type transistors, changing the operating region, and to some extent, increasing the width of the P-type transistors. In the case of the circuit of FIG. 1, the operating region cannot be changed, and increasing the transistor dimensions is at odds with oscillator tuning range and the linearity of a capacitor array controlled by switches such as that depicted in FIG. 1.

Various embodiments of the present invention provide alternative switches that more effectively limit flicker noise. Such switches may include relatively large P-type transistors in combination with one or more resistors that shield any capacitor array from the parasitic loading of the large P-type transistors. When combining with one or more resistors, by sizing the impedance present in transistors 110, 115, the signal swing across the P-type transistors can be significantly reduced causing the P-type transistors to operate exclusively in the linear region for the entire oscillation cycle, reducing the flicker noise introduced into the oscillator. Further, the noise voltage from the P-type transistors is divided across the series resistor(s), again reducing the flicker noise introduced into the oscillator.

Figure 2:
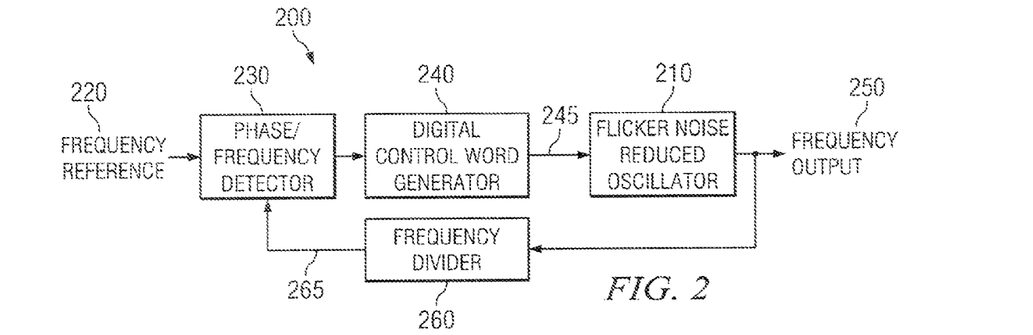
FIG. 2 depicts a phase locked loop including a flicker noise reduced oscillator in accordance with various embodiments of the present invention.

Turning to FIG. 2, a phase locked loop 200 is depicted including a flicker noise reduced oscillator 210 in accordance with various embodiments of the present invention. Phase locked loop circuit 200 includes a phase/frequency detector 230, a digital control word generator 240, flicker noise reduced oscillator 210, and a frequency divider 260. In operation, phase/frequency detector 230 compares a reference frequency 220 with a derivative 265 of a frequency output 250. Derivative 265 of frequency output 250 is created by dividing frequency output 250 using frequency divider circuit 260. Based on the comparison, phase/frequency detector 230 provides an indication of whether phase and frequency output 250 lags or leads frequency reference 220. This indication is provided to digital control word generator 240 that produces a multi-bit control word 245 to flicker noise reduced oscillator 210. Control word 245 selects a frequency that is to be generated by flicker noise reduced oscillator 210. In particular, where phase/frequency detector 230 indicates that frequency output 250 leads frequency reference 220, control word 245 is modified to reduce the frequency generated by flicker noise reduced oscillator 210. In contrast, where phase/frequency detector 230 indicates that frequency output 250 lags frequency reference 220, control word 245 is modified to increase the frequency generated by flicker noise reduced oscillator 210.

Figure 3:
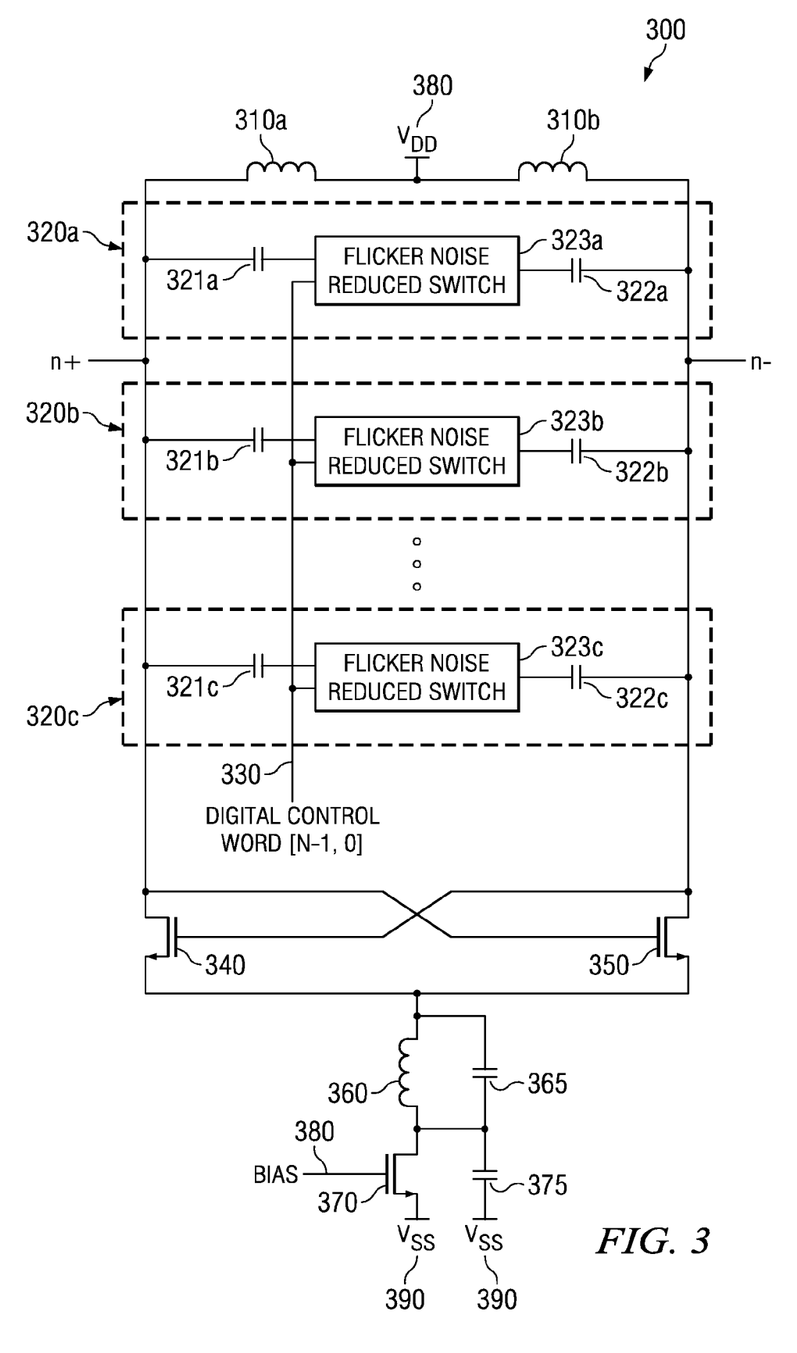
FIG. 3 depicts a flicker noise reduced oscillator circuit in accordance with various embodiments of the present invention.

Turning to FIG. 3, a flicker noise reduced oscillator circuit 300 is depicted in accordance with various embodiments of the present invention. Flicker noise reduced oscillator circuit 300 includes a number of switched capacitance banks 320. Each of switch capacitance banks 320 includes a bank capacitance that includes a capacitor 321 and a capacitor 322. Both capacitor 321 and capacitor 322 are switched using a flicker noise reduced switch 323 that is controlled by a particular bit of a control word 330. Each of switch capacitance banks 320 are connected in parallel such that closing flicker noise reduced switches 323 cause associated bank capacitance to be added to the overall capacitance of flicker noise reduced oscillator 300.

Flicker noise reduced oscillator 300 includes an inductance that is formed of an inductor 310a, an inductor 310b. An inductor 360 and capacitor 365 form a resonator operating at two times oscillation frequency to improve the oscillator performance. Capacitors 322 are electrically coupled to each other and to inductor 310b. Capacitors 321 are electrically coupled to each other and to inductor 310a. The other end of inductors 310 are electrically coupled to an upper voltage potential 380 or an ac ground. It should be noted that there are different oscillator topologies such as those that additionally have cross-coupled PMOS pairs on the very top of the schematic. In such example, the power supply would be connected to source nodes of the two PMOS transistors, and the center node where 310a and 310b couples could be an ac ground or simply floating. Further, capacitors 322 are electrically coupled to the drain of an N-type transistor 350, and to the gate of an N-type transistor 340. Capacitors 321 are electrically coupled to the drain of N-type transistor 340 and to the gate of N-type transistor 350. The source of N-type transistor 340 and the source of N-type transistor 350 are each electrically coupled to inductor 360, and the other end of inductor 360 is electrically coupled to the drain of an N-type transistor 370. The gate of N-type transistor 370 is electrically coupled to either upper voltage potential 380 or a bias voltage, and the source of N-type transistor 370 is electrically coupled to a lower voltage potential 390. A capacitor 375 is placed in parallel to transistor 370.

In operation, control word 330 is set to combine one or more of capacitors 321 and capacitors 322 with the inductance of flicker noise reduced oscillator 300. Changing the number of capacitors 321, 322 that are included in flicker noise reduced oscillator 300 modifies the number of frequencies that can be output from flicker noise reduced oscillator 300. Thus, where flicker noise reduced oscillator 300 is included in a phase locked loop circuit, a phase detector indicating that a frequency output leads a reference frequency results in a codeword causing a change in the number of selected switched capacitance banks 320 to be modified to cause a reduction in the frequency of the output. Alternatively, where the phase detector indicates that the frequency output lags a reference frequency, a codeword causing a change in the number of selected switched capacitance banks 320 to be modified to cause an increase in the frequency of the output is provided. Some embodiments of the present invention provide nearly continuous tuning from very low frequencies up to frequencies in excess of 100 GHz.

Figure 4A:
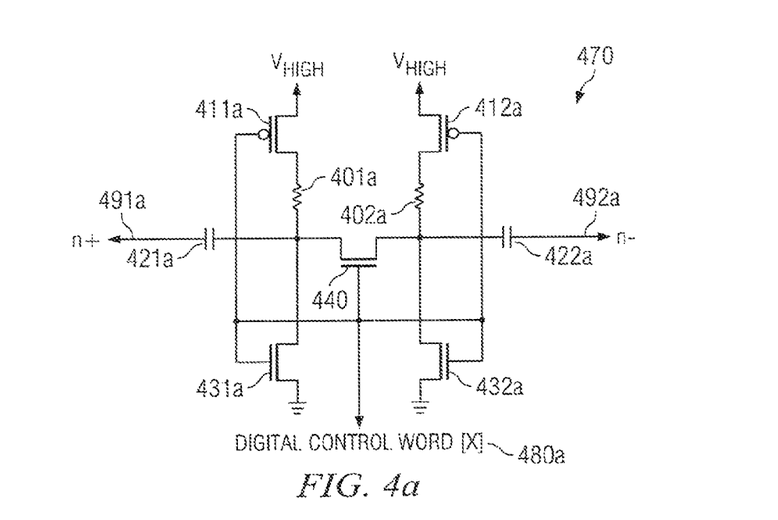
FIGS. 4a-4j show various types of flicker noise reducing switches in accordance with different embodiments of the present invention.

Flicker noise reduced switches 323 are designed to produce the appropriate switching action without the problematic flicker noise evident in existing switches. Examples of switched capacitor banks 320 including flicker noise reduced switches 323 are discussed in relation to FIG. 4 below. Turning to FIG. 4a, a flicker noise reducing switch 470 (i.e., a switched capacitor bank) is shown in accordance with various embodiments of the present invention. Flicker noise reducing switch 470 includes a capacitance comprised of a capacitor 421a and a capacitor 422a. One node of capacitor 421a is electrically coupled to a resistor 401a, to the drain of an N-type transistor 440, and to the drain of an N-type transistor 431a. The other node of capacitor 421a is electrically coupled to a time varying voltage input (n+) 491a. One node of capacitor 422a is electrically coupled to a resistor 402a, to the source of an N-type transistor 440, and to the drain of an N-type transistor 432a. The other node of capacitor 421a is electrically coupled to a time varying voltage input (n−) 492a. Time varying voltage 492a is approximately an inverted version of time varying voltage input (n+) 491a.

The source of N-type transistor 431a and the source of N-type transistor 432a are electrically coupled to a low voltage potential. Resistor 401a is electrically coupled between the drain of a P-type transistor 411a and capacitor 421a, and resistor 402a is electrically coupled between the drain of a P-type transistor 412a and capacitor 422a. The source of P-type transistor 411a and the source of P-type transistor 412a are electrically coupled to an upper voltage potential. A control word input 480a that may be one bit of a multi-bit control word is electrically coupled to the gates of N-type transistor 440, N-type transistor 431a, N-type transistor 432a, P-type transistor 411a and P-type transistor 412a. P-type transistors 411a, 412a provide a pull-up function, and N-type transistors 431a, 432a provide a pull-down function.

In operation, it is desirable for P-type transistor 411a and P-type transistor 412a to operate in the linear region as flicker noise is more pronounced when P-type transistor 411a and P-type transistor 412a enter saturation. To do this, the combination of P-type transistor 411a and resistor 401a and the combination of P-type transistor 412a and resistor 402a are chosen such that the aforementioned P-type transistors are maintained in the linear region over the signal swing of time varying voltages 491a, 492a. In addition, it is desirable to limit any parasitic capacitance of P-type transistor 411a and P-type transistor 412a that is visible to an oscillator circuit in which flicker noise reducing switch 470 is included (e.g., oscillator circuit 300). By including resistors 401a, 402a, P-type transistor 411a and P-type transistor 412a may be relatively large as the resistors cause any parasitic capacitance of P-type transistors 411a and 412a to be shielded from the oscillator circuit. For example, resistors 401a, 402a may be chosen to be substantially larger than the effective parallel resistance of the LC tank in the oscillator circuit. In some instances of the aforementioned embodiments, resistors 401a, 402a are chosen to be between ten times and forty times larger than the parallel resistance of the oscillator circuit. In such a case, resistors 401a, 402a appear to be circuit opens at the frequency of the oscillation, thus shielding the oscillator from any parasitic capacitance. In one particular embodiment of the present invention where the parallel resistance of the oscillator circuit is two hundred ohms (200Ω), resistors 401a, 402a are chosen to be seven thousand ohms (7 kΩ). It should also be noted that the use of resistors 401a, 402a allows for a wider control of the dimensions of P-type transistors 411a, 412a. For example, while prior art switches may demand the use of a small width transistor (e.g., 0.2×5 microns) to achieve a high impedance, various embodiments of the present invention may utilize larger width/length-ratio transistors (e.g., 5×0.2 microns) in combination with the resistor to provide a substantial impedance, or relatively large transistors (e.g., 6×6 microns). This avoids the negative effects of using smaller width transistors such as g-r noise in addition to flicker noise and thermal noise.

Figure 4B:
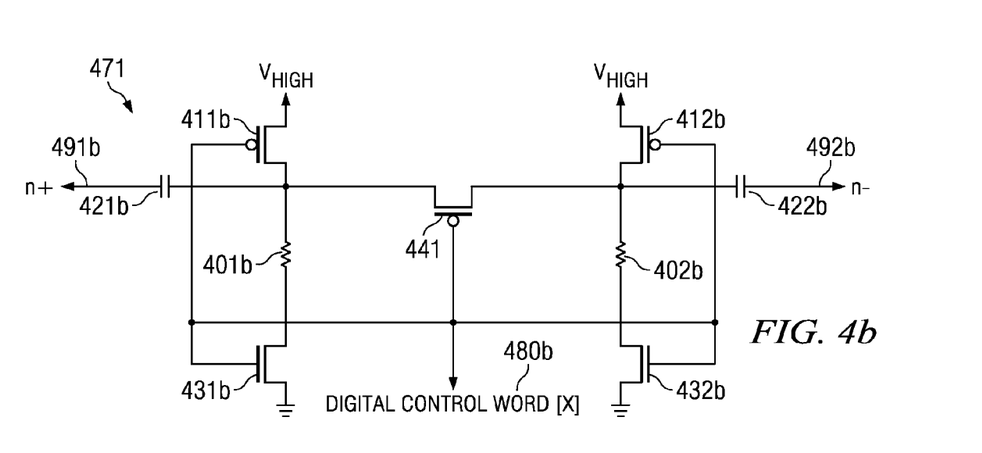

Turning to FIG. 4b, a flicker noise reducing switch 471 is shown in accordance with other embodiments of the present invention. Flicker noise reducing switch 471 is a PMOS equivalent of flicker noise reducing switch 470 with switch 440 replaced by switch 441 that is switched by control word input 480.

Figure 4C:
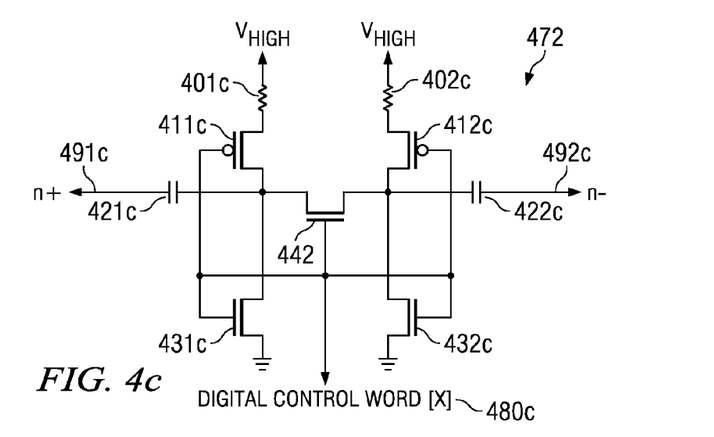

Turning to FIG. 4c, a flicker noise reducing switch 472 is shown in accordance with various embodiments of the present invention. Flicker noise reducing switch 472 includes a capacitance comprised of a capacitor 421c and a capacitor 422c. One node of capacitor 421c is electrically coupled to the drain of a P-type transistor 411c, to the drain of an N-type transistor 442, and to the drain of an N-type transistor 431c. The other node of capacitor 421c is electrically coupled to a time varying voltage input (n+) 491c. One node of capacitor 422c is electrically coupled to the drain of a P-type transistor 412c, to the source of N-type transistor 442, and to the drain of an N-type transistor 432c. The other node of capacitor 422c is electrically coupled to a time varying voltage input (n−) 492c. Time varying voltage 492c is approximately an inverted version of time varying voltage input (n+) 491c.

The source of N-type transistor 431c and the source of N-type transistor 432c are electrically coupled to a low voltage potential. The source of P-type transistor 411c and the source of P-type transistor 412c are electrically coupled to an upper voltage potential via a resistor 401c. A control word input 480c that may be one bit of a multi-bit control word is electrically coupled to the gates of N-type transistor 442, N-type transistor 431c, N-type transistor 432c, P-type transistor 411c and P-type transistor 412c. P-type transistors 411c, 412c provide a pull-up function, and N-type transistors 431c, 432c provide a pull-down function.

In operation, it is desirable for P-type transistor 411c and P-type transistor 412c to operate in the linear region as flicker noise is more pronounced when P-type transistor 411c and P-type transistor 412c enter saturation. To do this, the combination of P-type transistor 411c and resistor 401c and the combination of P-type transistor 412c and resistor 401c are chosen such that the aforementioned P-type transistors are maintained in the linear region over the signal swing of time varying voltages 491c, 492c. Further, it is desirable to limit any parasitic capacitance of P-type transistor 411c and P-type transistor 412c that is visible to an oscillator circuit in which flicker noise reducing switch 472 is included (e.g., oscillator circuit 300). To do this, P-type devices 411c, 412c are designed with aspect ratios that limit the amount of parasitic capacitance seen by the oscillator circuit. In contrast to prior art switched, high impedance P-type devices are not necessary due to the additive impedance provided by resistor 401c, and thus there is greater freedom in designing P-type devices 411c, 412c to avoid parasitic capacitance.

Figure 4D:
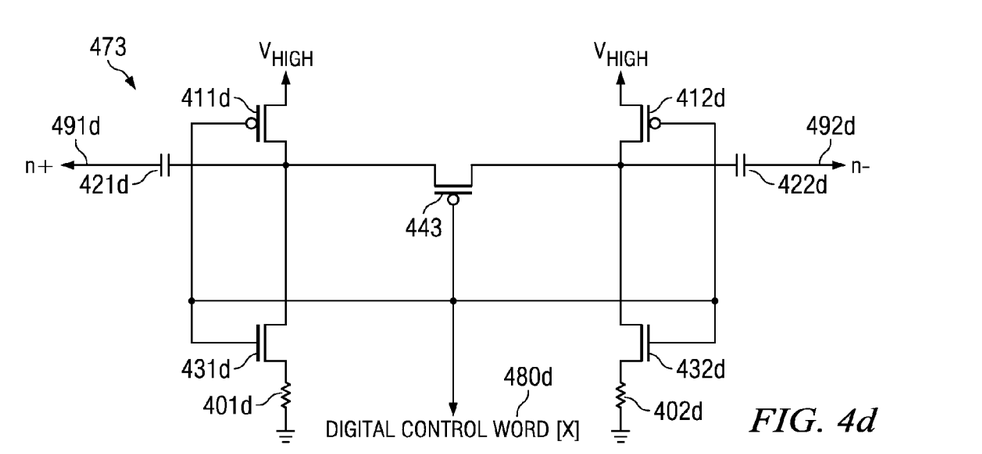

Turning to FIG. 4d, a flicker noise reducing switch 473 is shown in accordance with other embodiments of the present invention. Flicker noise reducing switch 473 is a PMOS equivalent of flicker noise reducing switch 472 with switch 442 replaced by switch 443 that is switched by control word input 480.

Figure 4E:
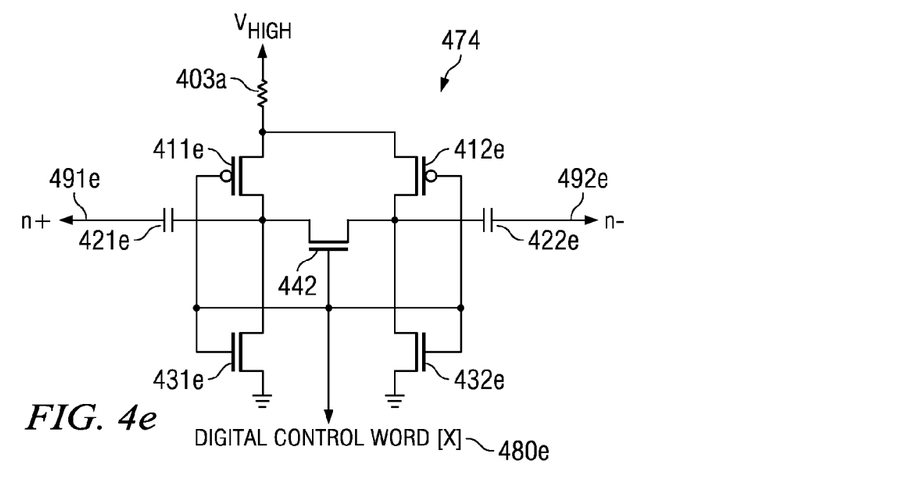

Turning to FIG. 4e, a flicker noise reducing switch 474 is shown in accordance with yet other embodiments of the present invention. Flicker noise reducing switch 474 is similar to flicker noise reducing switch 472 except that resistors 401c and resistor 402c are combined into a single resistor 403a.

Figure 4F:
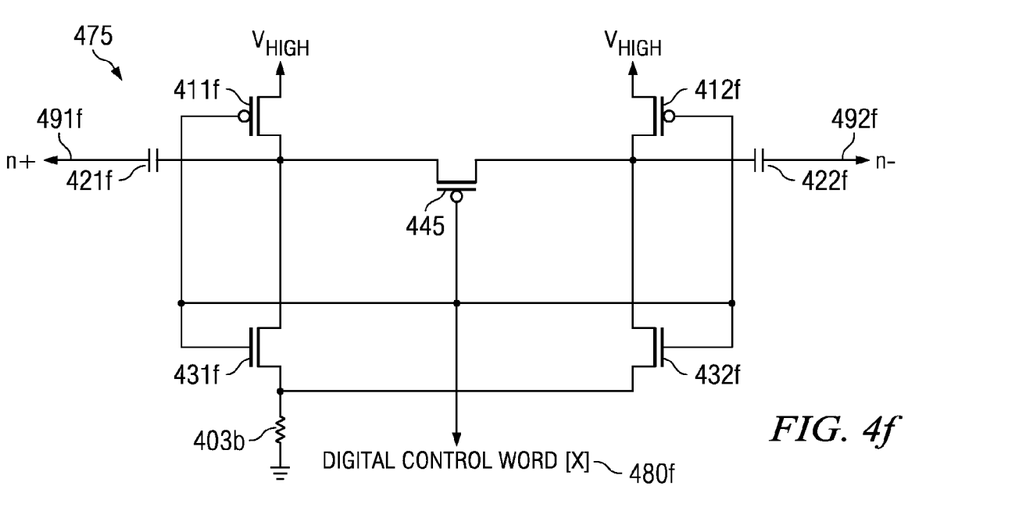

Turning to FIG. 4f, a flicker noise reducing switch 475 is shown in accordance with yet further embodiments of the present invention. Flicker noise reducing switch 475 is a PMOS equivalent of flicker noise reducing switch 474 with switch 442 replaced by switch 445 that is switched by control word input 480

Figure 4G:
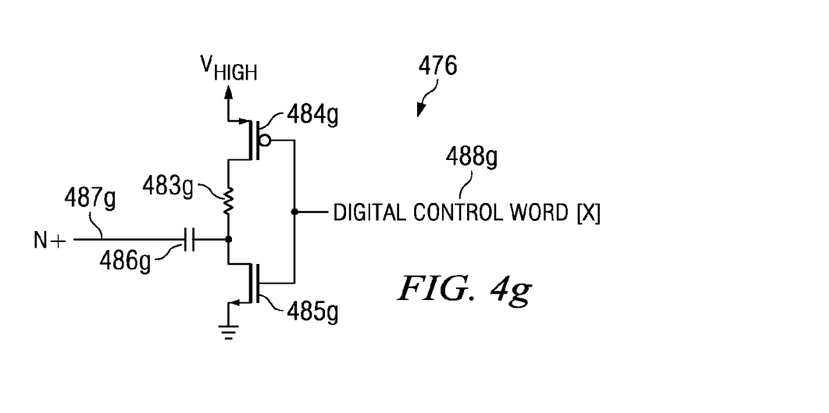
Figure 4H:
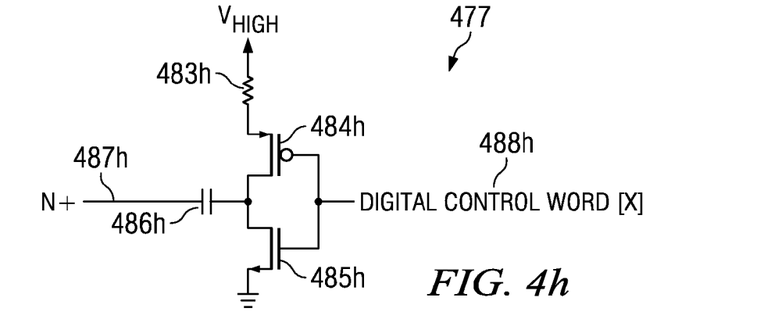
Figure 4I:
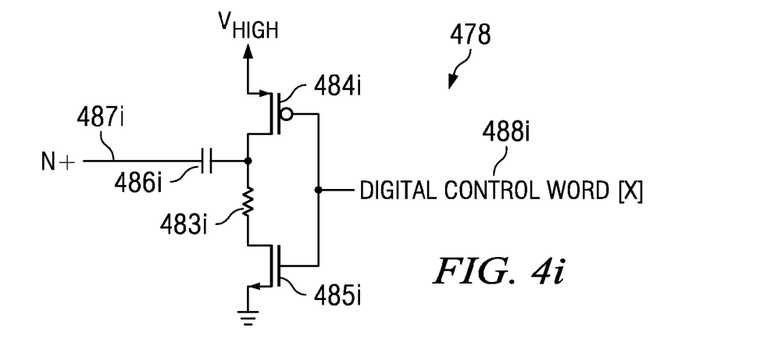
Figure 4J:
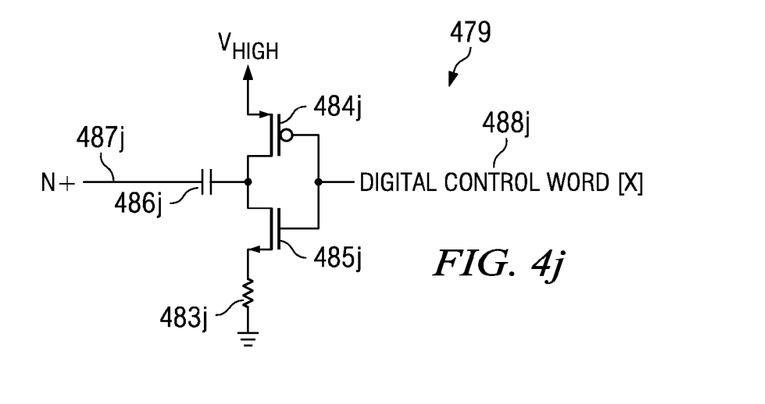

FIGS. 4g-4j depict single ended versions of the previously described flicker noise reducing switches in accordance with yet other embodiments of the present invention. Turning to FIG. 4g, a flicker noise reducing switch 476 is depicted. Flicker noise reducing switch 476 includes a pull-up PMOS device 484g with its gate electrically coupled to a control word input 488g, its source electrically coupled to an upper voltage potential, and its drain electrically coupled to a resistor 483g. The other end of resistor 483g is electrically coupled to a time varying input 487g via a capacitor 486g, and to a drain of an N-type transistor 485g operating as a main switch. The gate of N-type transistor 485g is also electrically coupled to control word input 488g. Such a configuration allows for use of a low impedance P-type device operating as a pull-up device with all of the advantages described above. Turning to FIG. 4h, a flicker noise reducing switch 477 is depicted that provides similar operational characteristics as a flicker noise reducing switch 476. Of note, the location of resistor 483 is modified. FIG. 4i shows a flicker noise reducing switch 478 that is a PMOS equivalent of flicker noise reducing switch 476 with P-type device 484 operating as a main switch, and N-type device 485 operating as a pull-down device. Similarly, FIG. 4j shows a flicker noise reducing switch 479 that is a PMOS equivalent of flicker noise reducing switch 477 with P-type device 484 operating as a main switch, and N-type device 485 operating as a pull-down device.

Figure 5:
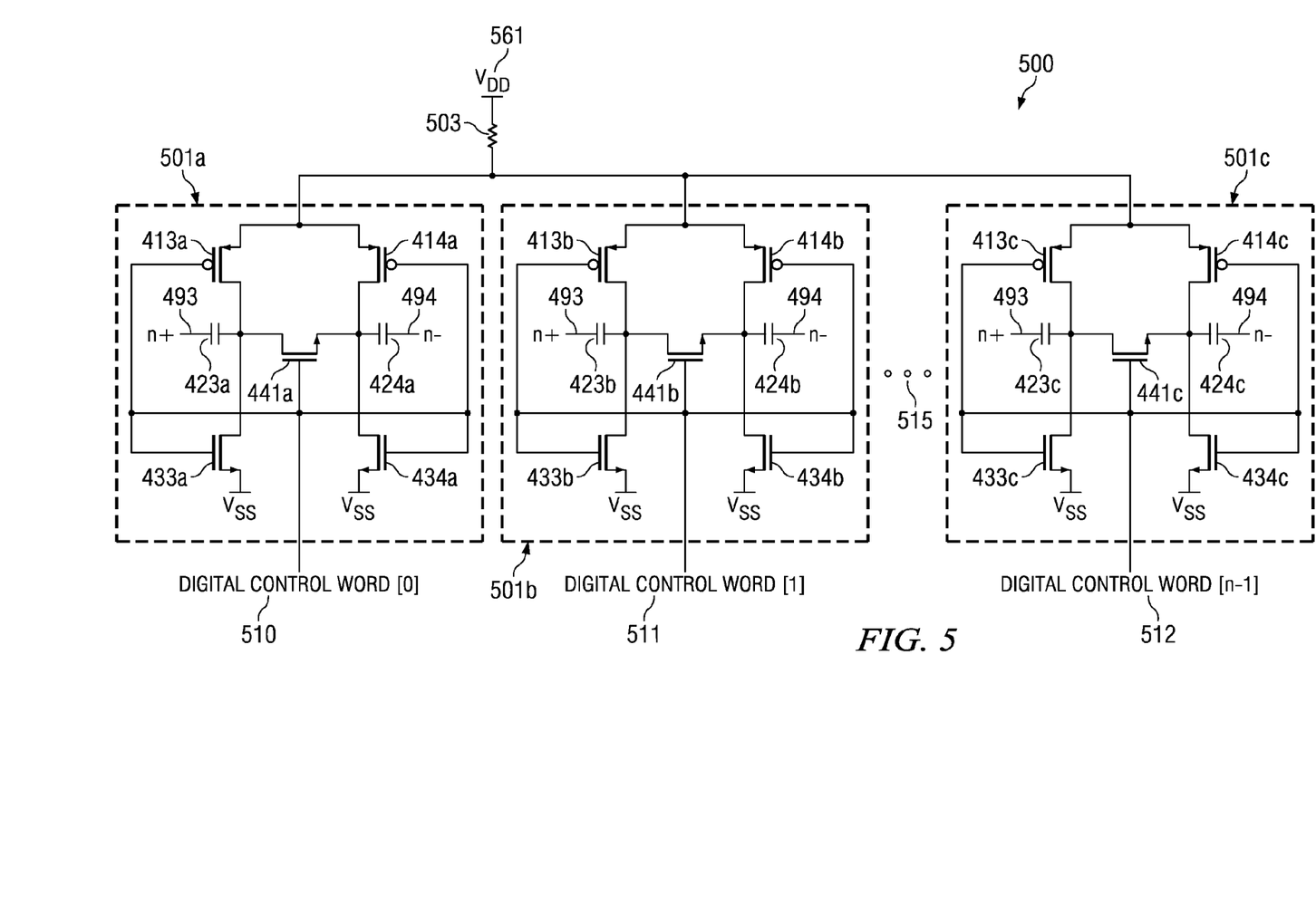
FIG. 5 depicts a combination of multiple flicker noise reducing switches in accordance with some embodiments of the present invention.

FIG. 5 depicts a combination circuit 500 including multiple flicker noise reducing switches 501 (i.e., switched capacitor banks) in accordance with some embodiments of the present invention. Combination circuit 500 may be included in an oscillator circuit that allows for selecting one or more capacitors to set a desired oscillation frequency. The capacitors may be selected using a digital control word that is electrically coupled to each of switched capacitor banks 501. It should be noted that while three flicker noise reducing switches 501 are shown, that the embodiment may include four or more switched capacitor banks connected in parallel as indicated by an extender symbol 515.

In this embodiment, a single resistor 503 is used to connect the sources of P-type transistors 413, 414 from all of flicker noise reducing switches 501. Such an approach saves area required to implement resistors. The gates of N-type transistor 441a, N-type transistor 433a, N-type transistor 434a, P-type transistor 413a and P-type transistor 414a are all connected to a bit 510 of a digital control word. The gates of N-type transistor 441b, N-type transistor 433b, N-type transistor 434b, P-type transistor 413b and P-type transistor 414b are all connected to a bit 511 of the digital control word. The gates of N-type transistor 441c, N-type transistor 433c, N-type transistor 434c, P-type transistor 413c and P-type transistor 414c are all connected to a bit 512 of the digital control word. In operation, when respective bits of the control word are asserted, the switched capacitor banks associated with the respective bits are switched such that the capacitance included in the switched capacitor bank is combined with other elements to define an output frequency of the oscillator.

Oscillators incorporating one or more flicker noise reduced switches in accordance with embodiments of the present invention may be deployed in a number of products. For example, such oscillators may be used in a system that includes a phase locked loop that utilizes flicker noise reduced switches. Such systems include, but are not limited to, transmitters, receivers, and cellular applications. Other systems may include a software defined radio chip that is able to operate at frequency covering GSM, GPRS, GPS, WLAN, BlueTooth™, WCDMA, DTV, and TV. Based on the disclosure provided herein, one of ordinary skill in the art will recognize a variety of products that may utilize oscillators in accordance with embodiments of the present invention, and a variety of frequencies that may be programmed through use of such oscillators. Additional oscillator designs that may be modified to incorporate flicker noise reduced switches in accordance with embodiments of the present invention are discussed in U.S. Pat. No. 6,791,422. The entirety of the aforementioned reference is incorporated herein by reference for all purposes.

In addition, it should be noted that the embodiments disclosed herein are P-substrate implementations using N-type transistors for the switch. Based on the disclosure provided herein, one of ordinary skill in the art will recognize corresponding circuits that are possible using P-type transistors for the switch.

In conclusion, the present invention provides novel systems, devices, methods and arrangements for implementing oscillators. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A digitally controlled oscillator circuit, the circuit comprising:

an oscillator circuit providing a frequency programmable output, and including:
  a first flicker noise reducing switch, wherein the first flicker noise reducing switch selectively switches a first capacitance in and out of the oscillator circuit; and
  a second flicker noise reducing switch, wherein the second flicker noise reducing switch selectively switches a second capacitance in and out of the oscillator circuit; and
a phase detector circuit receiving a frequency reference and a derivative of the output, and operable to compare the frequency reference with a derivative of the output, and to provide a control word based at least in part on the comparison of the frequency reference and the derivative of the output that governs switching of the first flicker noise reducing switch and the second flicker noise reducing switch,
wherein the first flicker noise reducing switch includes:
a first N-type transistor;
a second N-type transistor;
a third N-type transistor;
a first P-type transistor;
a second P-type transistor;
a resistor; and
wherein a source of the first P-type transistor and a source of the second P-type transistor are electrically coupled to an upper voltage threshold via the resistor; wherein a source of the first N-type transistor and a source of the second N-type transistor are electrically coupled to a lower voltage threshold; wherein a drain of the first P-type transistor is electrically coupled to a drain of the first N-type transistor, and a drain of the second P-type transistor is electrically coupled to a drain of the second N-type transistor; wherein a drain of the third N-type transistor is electrically coupled to a first portion of the first capacitance and to the drain of the first N-type transistor; wherein a source of the third N-type transistor is electrically coupled to a second portion of the first capacitance and to the drain of the second N-type transistor; and wherein the control word is electrically coupled to gates of the first N-type transistor, the second N-type transistor, the third N-type transistor, the first P-type transistor and the second P-type transistor; and
wherein the second flicker noise reducing switch includes:
a fourth N-type transistor;
a fifth N-type transistor;
a sixth N-type transistor;
a third P-type transistor;
a fourth P-type transistor; and
wherein a source of the third P-type transistor and a source of the fourth P-type transistor are electrically coupled to the upper voltage threshold via the resistor, wherein a source of the fourth N-type transistor and the fifth N-type transistor are electrically coupled to a lower voltage threshold; wherein the drain of the third P-type transistor is electrically coupled to the drain of the fourth N-type transistor, and the drain of the fourth P-type transistor is electrically coupled to the drain of the fifth N-type transistor; wherein a drain of the sixth N-type transistor is electrically coupled to a first portion of the second capacitance and to the drain of the fourth N-type transistor; wherein a source of the sixth N-type transistor is electrically coupled to a second portion of the second capacitance and to the drain of the fifth N-type transistor; and wherein the control word is electrically coupled to gates of the fourth N-type transistor, the fifth N-type transistor, the sixth N-type transistor, the third P-type transistor and the fourth P-type transistor.

* * * * *